United States Patent
Koplin et al.

Patent Number: 5,331,231
Date of Patent: Jul. 19, 1994

[54] RECTIFIER DEVICE FOR THREE-PHASE GENERATORS IN VEHICLES

[75] Inventors: Karl-Heinz Koplin, Schwieberdingen; Stefan Renner, Weissach-Flacht; Gerhard Pflueger; Henning Fasterding, both of Markgroeningen, all of Fed. Rep. of Germany

[73] Assignee: Robert Bosch GmbH, Stuttgart, Fed. Rep. of Germany

[21] Appl. No.: 838,432
[22] PCT Filed: May 25, 1990
[86] PCT No.: PCT/DE90/00382
§ 371 Date: Mar. 5, 1992
§ 102(e) Date: Mar. 5, 1992
[87] PCT Pub. No.: WO91/03836
PCT Pub. Date: Mar. 21, 1991

[30] Foreign Application Priority Data
Sep. 5, 1989 [DE] Fed. Rep. of Germany ....... 3929427

[51] Int. Cl.$^5$ .............................. H02K 11/00
[52] U.S. Cl. ..................... 310/68 D; 310/71
[58] Field of Search ............ 310/68 D, 71, 51, 64; 361/386, 388; 363/141, 145

[56] References Cited

U.S. PATENT DOCUMENTS

| | | | |
|---|---|---|---|
| 3,629,631 | 12/1971 | Thomas et al. | 310/68 D |
| 4,232,238 | 11/1980 | Saito et al. | 310/68 D |
| 4,419,597 | 12/1983 | Shiga et al. | 310/68 D |
| 4,554,574 | 11/1985 | Wright | 357/74 |
| 4,606,000 | 8/1986 | Steele et al. | 363/145 |
| 4,952,829 | 8/1990 | Armbruster et al. | 310/68 D |

FOREIGN PATENT DOCUMENTS

| | | | |
|---|---|---|---|
| 0088910 | 9/1983 | European Pat. Off. | 310/68 D |
| 2369731 | 5/1978 | France | 310/68 D |
| 8902161 | 3/1989 | PCT Int'l Appl. | 310/68 D |
| 1452157 | 10/1976 | United Kingdom | 310/68 D |

*Primary Examiner*—Steven L. Stephan
*Assistant Examiner*—Matthew Nguyen
*Attorney, Agent, or Firm*—Michael J. Striker

[57] ABSTRACT

The rectifier device has a metallic front cooling plate and a rear cooling plate spaced from each other and extending parallel to each other; positive diodes arranged on one cooling plate and negative diodes arranged on the other cooling plate; a printed circuit board made of insulating material fastened between the cooling plates and having conductors for connecting the diodes with each other and also with a three-phrase generator; electrical connection device for making electrical connection with the front cooling plate comprising a threaded bolt having a flange, an annular shoulder and an axial pin projecting into an opening of the rear cooling plate, the threaded bolt being pressed in a hole in the front cooling plate and the flange and shoulder being dimensioned so that the annular shoulder contacts on a rear side of the front cooling plate, and a nut screwed on the threaded bolt from a front side of the front cooling plate to secure the threaded bolt in the hole; and an insulating material bush received in the opening for electrically insulating the threaded bolt from the rear cooling plate.

9 Claims, 1 Drawing Sheet

RECTIFIER DEVICE FOR THREE-PHASE GENERATORS IN VEHICLES

BACKGROUND OF THE INVENTION

The present invention relates to a rectifier device for three-phase generators in vehicles.

More particularly it relates to a rectifier device having two metallic cooling plates, and diodes inserted in the latter and having a printed circuit board and a positive connection including a threaded bolt.

In a rectifier device of this type known from the German Utility Model G 87 11 178 a connecting bolt for the connection of the rectifier device, which connection is designated by B+ according to German Industrial Standard, is inserted into the outer cooling plate of the two cooling plates of the rectifier diodes lying parallel at a distance to one another in that it is pressed into a corresponding hole of the outer cooling plate with a flange and contacts the annular shoulder of the screw head at the back of the cooling plate. The threaded bolt is tightly screwed to the cooling plate with a nut for protection. The rectifier device is mounted at the so-called B side of the three-phase generator. After the generator is installed in the vehicle a connection cable for the positive pole of the vehicle battery is securely screwed on to the free end of the threaded bolt.

A disadvantage in such solutions consists in that forces can act on the connection during strong vibrations and high starting torques and bending moments resulting in a deformation of the cooling plate or loosening of the fastening at the flange.

SUMMARY OF THE INVENTION

Accordingly, it is an object of the present invention to provide a rectifier device which avoids the disadvantages of the prior art.

More particularly, it is an object of the present invention to provide a rectifier device in which forces acting on a connecting bolt providing an electrical connection to the front cooling plate are distributed so that the bolt can withstand required stresses.

According to the invention, the rectifier device for a three-phase generator of a vehicle, comprises a metallic front cooling plate provided with a hole and a rear cooling plate provided with an opening, the cooling plates being spaced from each other and extending parallel to each other; a plurality of positive diodes arranged on one cooling plate and a plurality of negative diodes arranged on the other cooling plate; a printed circuit board made of insulating material fastened between the front and rear cooling plates and having electrical conductors for connecting the diodes with each other and also with a three-phrase generator; electrical connection means for making electrical connection with the front cooling plate comprising a nut and a threaded bolt having a flange, an annular shoulder and an axial pin projecting into the opening of the rear cooling plate, the threaded bolt being pressed in the hole in the front cooling plate and the flange and shoulder being positioned and dimensioned so that the annular shoulder contacts on the rear side of the front cooling plate, the nut being screwed on the threaded bolt from the front side of the front cooling plate to secure the threaded bolt in the hole; and insulating means for electrically insulating the threaded bolt from the rear cooling plate, the insulating means being received in the opening and receiving the axial pin.

When the rectifier device is designed in accordance with the present invention, it has the advantage that the forces of vibrations, starting torques and bending moments are transmitted into the two cooling plates. The bending forces in particular are ineffective since they are transmitted into the two cooling plates parallel to the plate planes. Accordingly, a deformation of the positive cooling plate is no longer possible. Another advantage consists in that this solution can be realized without additional structural component parts.

A particularly advantageous construction consists in that the insulating material bush for the rear pin of the threaded bolt of the positive connection of the rectifier device is formed on at the printed circuit board located between the two cooling plates.

A metal bush is supported in a particularly suitable manner in a protective cap of insulating material in a floating manner and so as to be fixed with respect to rotation relative to it to prevent or reduce starting torques at the fastening point of the threaded bolt at the positive cooling plate. The threaded bolt projects out through the metal bush. The metal bush is advisably provided with a hexagonal outer contour and is guided into a hexagon receptacle of the protective cap so as to be fixed with respect to rotation relative to it. Further, the metal bush is advantageously secured against falling out of the hexagon receptacle of the protective cap in that a plurality of radial projections are formed on at the end areas of the hexagon receptacle in each instance.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF A PREFERRED EMBODIMENT

Figure 1:
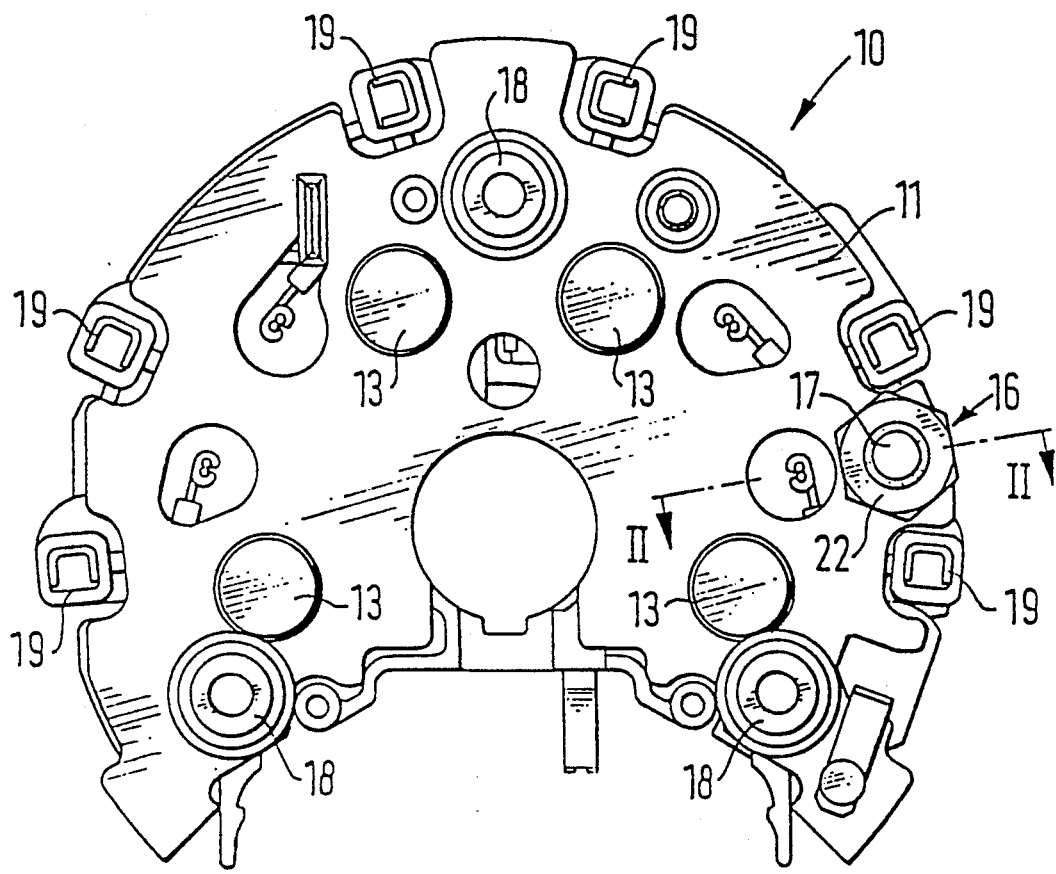
FIG. 1 is a front view of the rectifier device of a three-phase generator according to the invention and FIG. 2 shows a cross section through this device according to line II—II from FIG. 1.
Figure 2:
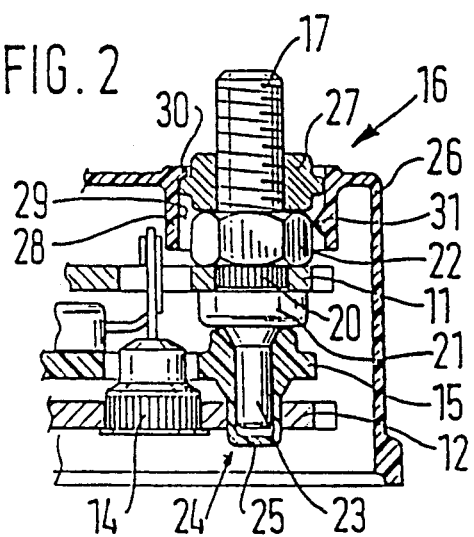

The construction of the rectifier device, according to the invention, which is designated by 10, is composed in a known manner (see G 87 11 178) of a sandwich-type arrangement of two metallic cooling plates 11, 12 extending parallel at a distance to one another. A plurality of positive diodes 13 are inserted in the outer positive cooling plate 11 which can be seen in FIG. 1. Negative diodes 14, only one of which can be seen in FIG. 2, are inserted in the rear negative cooling plate 12. Further, a printed circuit board 15 of insulating material is fastened between the two cooling plates 11, 12. Conductors, not shown, for connecting the diodes 13, 14 with one another and with connection wires, not shown, of the stator winding of the respective three-phase generator are embedded in the printed circuit board 15. Moreover, the front positive cooling plate 11 is provided with a positive connection 16 comprising a threaded bolt 17 at which a battery connection cable, not shown, of a vehicle is connected in the mounted state of the three-phase generator. The two cooling plates 11 and 12 and the printed circuit board 15 located between the latter are securely connected with one another by three hollow rivets 18 so as to be electrically insulated. The rectifier device 10 is securely screwed to an end shield of the three-phase generator by three screws which are guided through these hollow rivets 18. After the rectifier device 10 is mounted at the three-phase generator, the diodes 13 and 14 are electrically connected with the connection wires of the stator winding by a plurality of external crimp connectors 19 in the printed circuit board 15.

The positive connection 16 which can be seen in cross section from FIG. 2 is connected with the positive cooling plate 11 so as to be electrically conducting in that its threaded bolt 17 is pressed into a corresponding hole of the cooling plate 11 with a flange 20. The threaded bolt 17 contacts the rear of the cooling plate 11 with an annular shoulder 21 located behind the flange 20. It is securely screwed to the cooling plate 11 in addition by a nut 22. The threaded bolt 17 projects into an opening 24, preferably into a hole of the rear cooling plate 12, with an axial pin 23 formed on behind the annular shoulder 21. Since this cooling plate 12 is connected to negative potential, the pin 23 is received in an insulating material bush 25 which is inserted into the opening 24. The insulating material bush 25 is formed on at the outer area of the printed circuit board 15 which is clamped in between the positive cooling plate 11 and the negative cooling plate 12.

The rectifier device 10 is covered externally by a pot-shaped protective cap 26 which has venting slits in its base as well as openings for the connections of the rectifier device. To keep torque loads as far away from the flange 20 as possible at the positive connection 16 when screwing on or unscrewing a cable, the front end of the threaded bolt 17 projects through a metal bush 27. The bush is supported in an opening of the protective cap 26 in a floating manner and so as to be fixed with respect to rotation relative to it. For this purpose a collar 28 is formed on at the opening of the protective cap 26. The collar 28 has a hexagon receptacle 29 at the inside in which the metal bush 27 is axially guided and secured with respect to rotation by a hexagonal outer contour. To prevent the metal bush 27 from falling out of the hexagon receptacle 29 of the protective cap 26, three radially directed projections 30 which are uniformly distributed along the circumference are formed on at the protective cap 26 at the front end of the hexagon receptacle 29 and an additional three radially inwardly directed projections 31 are provided in the rear area of the hexagon receptacle 29. Of the projections 30 and 31, only one projection 30 and 31 can be seen in FIG. 2.

Since the rectifier device 10 is usually situated vertically after installing the generator in the vehicle, the forces occurring at the positive connection 16 during vibrations are transmitted via the flange 20 into the positive cooling plate 11 on the one hand and via the pin 23 and the insulating material bush 25 into the negative cooling plate 12 on the other hand. Bending forces occurring at the threaded bolt via the pin 23 when connecting or removing a connection cable are likewise absorbed substantially by the rear cooling plate 12 parallel to the plane of the cooling plate and a bending of the front cooling plate 11 is accordingly reliably prevented. Moreover, the floating metal bush 27 in the protective cap 26 prevents the torque from being transmitted to the lower nut 22 when loosening the connection cable even when the connection is rusted on, since the metal bush 27 transmits these forces to the hexagon receptacle 29 of the protective cap 26 via its outer contour. A loosening of the threaded bolt 17 is accordingly reliably prevented.

It will be understood that each of the elements described above, or two or more together, may also find a useful application in other types of constructions differing from the types described above.

While the invention has been illustrated and described as embodied in a rectifier device for three-phase generators in vehicles, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A rectifier device for a three-phase generator of a vehicle, said rectifier device comprising a metallic front cooling plate having a front side and a rear side and provided with a hole, and a rear cooling plate provided with an opening, said cooling plates being spaced from each other and extending parallel to each other; a plurality of positive diodes arranged on one of said cooling plates and a plurality of negative diodes arranged on another of said cooling plates; a printed circuit board made of insulating material fastened between said front and rear cooling plates, said printed circuit board having electrical conductors for connecting said diodes with each other and also with said three-phase generator; electrical connection means for making electrical connection with said front cooling plate comprising a nut and a threaded bolt having a flange, an annular shoulder and an axial pin projecting into said opening of said rear cooling plate, said threaded bolt being pressed in said hole in said front cooling plate, and said flange and said shoulder being positioned and dimensioned so that said annular shoulder contacts on said rear side of said front cooling plate, the nut being screwed on said threaded bolt from said front side of said front cooling plate to secure said threaded bolt in said hole; and insulating means for electrically insulating said threaded bolt from said rear cooling plate, said insulating means being received in said opening and receiving said axial pin.

2. A rectified device as defined in claim 1, wherein said insulating means comprises an insulating material bush received in said opening, said axial pin of said threaded bolt being received in said insulating material bush.

3. A rectifier device as defined in claim 2, wherein said insulating material bush is formed on said printed circuit board in the region between said cooling plates.

4. A rectifier device as defined in claim 1, and further comprising a protective cap of insulating material and having an opening, said threaded bolt projecting through said opening of said protective cap in a floating manner and so as to be fixed with respect to rotation relative to said protective cap.

5. A rectifier device as defined in claim 4, wherein said protective cap has a collar bordering said opening.

6. A rectifier device as defined in claim 5; and further comprising a metal bush which is supported in said opening of said protective cap and receives said threaded bolt.

7. A rectifier device as defined in claim 6, wherein said collar of said protective cap has a hexagon receptacle, said metal bush having a hexagonal outer contour which is axially guided in said hexagon receptacle of said collar.

8. A rectifier device as defined in claim 7; and further comprising means for preventing falling out of said metal bush from said hexagon receptacle of said protective cap.

9. A rectifier device as defined in claim 8, wherein said preventing means includes a plurality of projections which are directed radially inward and formed on end areas of said hexagon receptacle of said collar.

* * * * *